United States Patent [19] [11] 4,027,323
Lorenze, Jr. et al. [45] May 31, 1977

[54] PHOTODETECTOR ARRAY DELINEATION METHOD

[75] Inventors: Robert V. Lorenze, Jr., Westford; Miriam F. Young, Dorchester, both of Mass.

[73] Assignee: Honeywell Inc., Minneapolis, Minn.

[22] Filed: Sept. 7, 1976

[21] Appl. No.: 720,918

[52] U.S. Cl. .................................. 357/30; 357/55; 51/310; 73/355 R; 156/630; 428/137; 428/192; 428/201; 428/913; 156/645; 156/661; 156/656
[51] Int. Cl.² ................. H01L 27/14; H01L 31/00; C23F 1/00; C23G 1/00
[58] Field of Search ...................... 156/3, 6, 11, 17; 357/30, 55; 51/310, 311, 312; 338/15, 17; 73/355 R; 428/137, 192, 201, 913

[56] References Cited
UNITED STATES PATENTS

| 3,545,996 | 12/1970 | Duncan | 51/310 |
| 3,550,260 | 12/1970 | Saltich et al. | 357/55 |
| 3,814,993 | 6/1974 | Kennedy | 357/30 |
| 3,821,777 | 6/1974 | James | 357/30 |
| 3,846,822 | 11/1974 | Riley et al. | 357/68 |

Primary Examiner—George F. Lesmes
Assistant Examiner—William R. Dixon, Jr.
Attorney, Agent, or Firm—Henry L. Hanson; John S. Munday; Roger W. Jensen

[57] ABSTRACT

A novel mask is used to contour the photodetector body and adhesive layer of a photodetector device on a substrate in which the mask apertures define an angle with the plane of the substrate. Air abrasion at that angle removes unwanted portions of the photodetector body and adhesive layer, leaving a contour desirable for subsequent interconnect metallization.

12 Claims, 8 Drawing Figures

PHOTODETECTOR ARRAY DELINEATION METHOD

BACKGROUND OF THE INVENTION

The Government has rights in this invention pursuant to Contract No. F33615-74-C-1069 awarded by the Department of the Air Force.

Conventional wire bonding to the metallized semiconductor material of a photodetector array has been found to be a primary source of device instability and failure. Advances in technology have produced arrays which have many individual units. Technology has improved to the point where this large number of detector elements provides a great number of data points which can be meaningfully processed. As the individual detector elements are more closely spaced to one another, and as more of them are employed in a single array, the likelihood of conventional wire bonding being the cause of failure of one or more of the detector units increases. The usefulness of these arrays depends on a very low failure rate of individual elements. It is, therefore, extremely desirable to find a method for manufacturing many nearly identical photodetector elements in a manner such that conventional wire bonding directly to the metallized semiconductor material is eliminated and electrical contact to the photodetector elements is provided by a more reliable interconnect method.

It is conventional to prepare individual elements from a photodetector body by using a mask, whereby the unwanted portions of the body are exposed to a process of removal which does not penetrate the mask and disturb the desired elements. However, none of the masking techniques which have been proposed are suitable for accurately producing individual elements of high uniformity in a manner which permits rapid and reliable attachments of electrical leads from the individual photodetector elements to printed circuitry on the substrate without the use of conventional wire bonded interconnects.

DESCRIPTION OF THE PRIOR ART

U.S. Pat. No. 3,883,437, describes a particular device showing the utility of an image scanned array of infrared radiation detectors in which signals generated therefrom are employed for subsequent processing.

U.S. Pat. No. 3,412,456 discloses a method for producing semiconductor devices wherein wire lead are attached to the semiconductor element.

U.S. Pat. 2,989,426 discloses a method of removing unused portions of a semiconductor. Various methods mentioned include etching through chemical and/or electrolytic means. Also disclosed is sandblasting as a method for removing unwanted material.

U.S. Pat. No. 3,846,822 discloses a method in which a field effect tansistor having a source, channel, drift and drain regions, and a gate electrode electrically isolated from the drift region is made by using an oxide mesa to define the boundaries of the gate electrode, drift region and drain region. The gate electrode is formed by using the mesa as a shadow mask during an ion milling operation.

Finally, U.S. Pat. No. 3,574,926 describes a process for the manufacture of an electric resistance for a hybrid miniaturized circuit from a wafer of a semiconductor material by preparing the wafer with dimensions exceeding those corresponding to the required dimensions, diamond cutting the wafer into smaller sizes, and ultimately adjusting the smaller wafers to the required resistance value by removing material therefrom by means of an abrasive powder stream.

OBJECTS OF THE INVENTION

It is, therefore, an object of this invention to provide a method for preparing a photodetector array comprised of a plurality of individual elements made from a photodetector body and mounted on a substrate.

Another object of this invention is to provide a method of shaping the step from the top surface of the photodetector elements over the adhesive layer to the substrate, so that continuous thin film conductor paths can be deposited over the step to interconnect with printed circuitry on the substrate, thus eliminating the need for a wire bonded interconnect.

Other objects will appear hereinafter.

DESCRIPTION OF THE INVENTION

It has now been discovered that the above and other objects of this invention can be accomplished in the following manner. Specifically, a method of preparing individual photodetector elements on a substrate for use in an array has been found which includes placing an adhesive on a substrate, mounting a body of the photodetector on said adhesive, delineating individual elements, placing a mask on the photodetector body as hereinafter defined, and air abrading the mask in a direction to remove undesirable photodetector body and adhesive from the substrate and removing the mask from the remaining individual photodetector elements thereby formed. It has been discovered that the use of a mask as hereinafter described permits the formation of a bevel angle edge on the semiconductor elements and adhesive which is highly suitable for the deposition of metal thin film leads which provide electrical contact to the individual elements.

Specifically, a mask for use in the instant process includes a first and second erosion resistant outer layers and a relatively soft layer attached to and in between the two outer layers. The two outer layers define apertures for access to portions of the substrate and the photodetector body not part of the desired individual photodetector elements. The first outer layer is closer to the photodetector body and has a smaller aperture than the second outer layer in that a line from the aperture of the second outer layer to the aperture of the first outer layer intersects the substrate at an angle of from 30° to 60°, with respect to the plane of the substrate, thereby defining a bevel angle. In a preferred embodiment of this invention, the angle above described ranges from 40° to 50°. Most preferred is an angle of approximately 45°, plus or minus 2°.

As a further embodiment, and as an option to one practicing the present invention, an additional step may be employed which comprises subsequently removing a portion of the photodetector element without removing substantially any adhesive so that the removed portion of the photodetector element causes the element to define an equivalent angle with the base of the substrate without changing the previously defined bevel angle of the adhesive. Conventional chemical etching can be employed wherein the etchant is inert to the substrate and the adhesive but selectively attacks the photoconductor element.

With the wide variety of uses to which photodetector arrays are put, individual elements may come in a wide variety of sizes. Selection of the mask and aperture to give the correct bevel angle will be routine, given the desired size of the individual element. For example, with an element having a thickness of about 0.01 millimeters, mounted on a substrate with a 0.01 millimeter thick adhesive, the overall thickness of the mask will be approximately 0.18 millimeters. Each of the two erosion resistant outer layers will be approximately 0.025 millimeters thick and the relatively soft layer inbetween the outer layers will be approximately 0.13 millimeters thick, giving an overall thickness to the mask of approximately 0.18 millimeters. The aperture of the lower or closer outer layer attached to the photodetector will be smaller than the upper outer layer. A line from the aperture of the upper or second outer layer to the aperture of the first outer layer passes through the photodetector body and adhesive to intersect the plane of the substrate at an angle. This angle is defined as a bevel angle, and may range from 30° to 60°. Preferrably, 40° to 50° has been found to be an effective bevel angle. Most preferred is a bevel angle of approximately 45°, plus or minus 2°.

The outer layers of the mask are manufactured from erosion resistant material which is capable of withstanding air abrasion but which can be photolithographically processed and etched to define precise apertures. Typical materials are hard metals such as nickel, steel, chrome and alloys thereof. The inner layer of the mask is constructed from a softer metal, so that this material, though it is capable of being air abraded, will not interfere with the removal of the undesirable photodetector body and adhesive and will not interpose itself between the line drawn through the aperture and intersecting with the plane of the substrate. Typical inner layer materials are copper, lead, tin and alloys thereof.

Once the air abrasion has been completed, the mask may be removed, leaving individual photodetector elements produced from the body of photodetector. The individual elements have at least one side, depending upon the number of sides subjected to the process of this invention, which is sloped at a bevel angle of 30° to 60° with respect to the plane of the substrate. Of course, in preferred embodiments, this bevel angle will be approximately 45°, plus or minus 2°. At this point, the individual elements are ready for attachment thereto of individual thin film leads by a wide variety of methods. The beveled step between the photodetector top surface and metallization layers on the substrate permits a favorable topography over which metal thin film interconnects can be deposited by, for example, vacuum deposition techniques (evaporation, sputtering). In order to consistently deposit continuous metal thin film interconnects over steps of this height (typically 0.02 millimeters) by conventional means, arbitrary step contours by unacceptable, and beveled contours such as that described herein are necessary. For example, a metal thin film interconnect may be evaporation deposited through a mask to produce an interconnect from the element to the substrate metallization. Fabrication of arrays employing the process of this invention and using thin film interconnects to the individual elements has provided completely satisfactory devices with no adverse effects on the device characteristics. Since the aperture patterns of the metal air abrasion mask are typically defined by photolithography and etch techniques, they can be repeated over a large mask area permitting many photodetector arrays to be beveled simultaneously. The procedure is thus suited to multiple array fabrication techniques.

DESCRIPTION OF THE DRAWINGS

For a more complete understanding of the invention, reference is hereby made to the drawings, in which:

As shown in FIG. 1, a substrate 12 is prepared in a conventional manner for utilization as part of a photodetector array. Metal lands 14 are attached to the substrate 12 in a conventional manner to conduct signals generated by the photodetector once leads are attached to the photodetector and the lands.

In FIG. 2, a quantity of adhesive 18 is placed on the substrate 12 to bond the photodetector body 20 thereon. As an optional step, a protector for the lands 16 may be applied to prevent contamination of the lands with the adhesive. Such protector element 16 should be made from photoresist or other materials which are easily removed in a conventional manner.

FIGS. 3 and 4 show the delineation of individual photodetector elements or arrays from the body 20 of the photodetector material. As shown in FIG. 3, a photo resist mask 21 is placed on the photodetector body 20. In FIG. 4, the undesired portions of the photodetector body 20 have been removed, through an etching process of conventional technology, leaving a quantity of adhesive 18 covering the protector layer 16 on top of the conductive layers 14.

FIG. 5 shows placement of a mask on the photodetector body 20 in a manner hereinafter described. The mask consists of outer layers 22 and 24 which are made from erosion resistant materials as hereinbefore described. Sandwiched between the outer layers 22 and 24 is an inner layer 26 of a relatively soft material, so that it does not interfere with the operation of the two outer layers. The mask is positioned such that the ouer layers 22 and 24 define an aperture or hole which permits access to the unwanted portion of the photodetector body and adhesive. The outer layer 24 which is adjacent the photodetector, has a smaller aperture in that it covers more of the photodetector 20 than does the upper outer layer 22. A line 28 drawn through the aperture formed by the outer layers 22 and 24 intersects the plane of the substrate 12, defining an angle 29 between the line and the plane of the substrate 12. Air abrasion in the direction shown by arrow 30, which is parallel to the line 28, causes removal of the undesired portions of the semiconductor body 20 and adhesive 18.

As shown in FIG. 6, after removal of the mask, the semiconductor body 20 is bonded through adhesive 18 to the substrate 12 and the unwanted portions of the adhesive 18 and semiconductor body 20 have been removed, leaving the desired bevel. If the photodetector configuration is such that additional beveled areas are required for lead interconnect, the mask is simply reapplied and the procedure repeated until all areas are processed. Subsequently, the epoxy layers 18 covering the conductive layers 14 are removed by mechanical and/or chemical means conventionally available to those skilled workers in the art. Connection of the semiconductor body 20 to the land area 14 can now be accomplished.

In FIG. 7, an additional embodiment of the present invention is shown. The figure shows a complete removal of all of the unwanted portions of the adhesive 18 and semiconductor 20 so that the detector element 20 is present in its desired state. The left side of the semiconductor 20 and the adhesive 18 is sloped at a bevel as hereinbefore described. On the right side of the semiconductor 20, a subsequent step has been shown wherein a portion of the photodetector 20 has been removed at side 19 by conventional methods such as chemical etching. The adhesive 18 has been substantially unaffected by the removal of the portion of the photodetector element. The remaining portion of the photodetector element defines an angle with the base of the substrate 12 which is approximately equivalent to the previously described bevel angle of the adhesive 18. Attachment of thin film leads, by one method or another, is shown in FIG. 8, which permits positive and trouble free connection between the land area 14 and the semiconductor element 20. Lead 32 is an evaporated thin film interconnect from the photodector 20 to the land area 14. The advantage of using the additional processing step which produces side 19 on the photodetector body is that an improved surface condition on the photodetector material can be obtained just prior to contact metallization.

Figure 1:
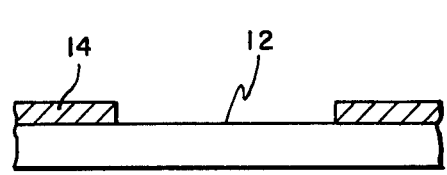
FIGS. 1–8 illustrate a preferred method according to this invention by showing a sectioned view of a substrate as the individual steps are taken to mount individual photodetector elements on the substrate.
Figure 2:
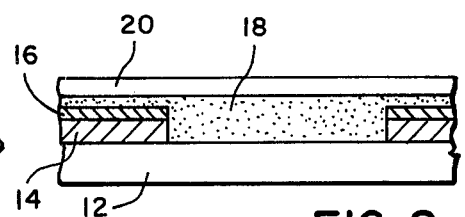
Figure 4:
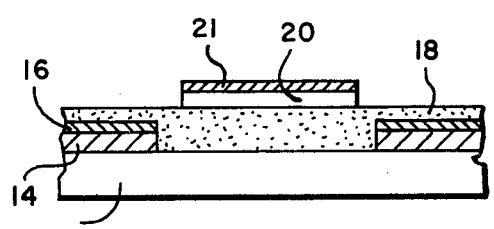
Figure 3:
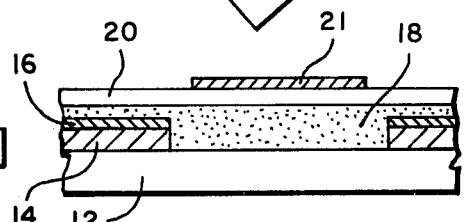
Figure 5:
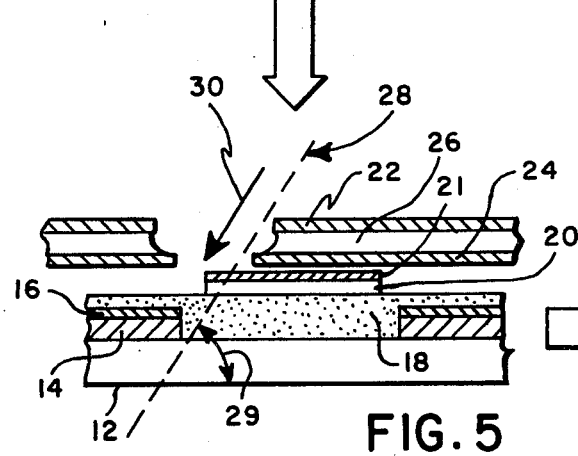
Figure 6:
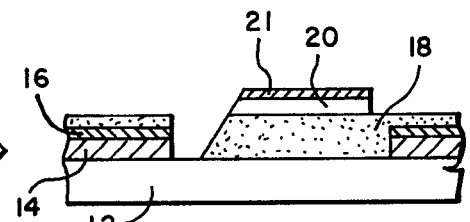
Figure 8:
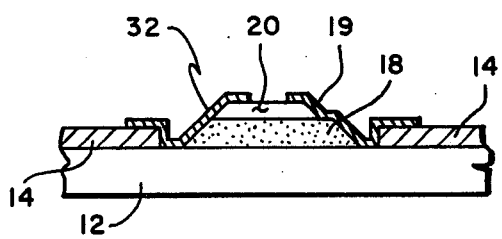
Figure 7:
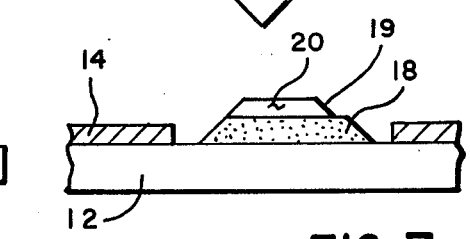

Fabrication of detector arrays employing the process herein described has resulted in devices which operate effectively and efficiently, with a high degree of operability of the individual detector elements. Failure rate due to lack of a proper bond between the lead and the photodetector element has been improved, giving results superior to other methods previously employed.

The embodiments of the invention in which an exclusive property or right is claimed are defined as follows:

1. A method of preparing individual photodetector elements on a substrate for use in an array comprising:
    placing an adhesive on the substrate;
    mounting a body of the photodetector on said adhesive;
    placing a mask on said photodetector body, said mask having first and second erosion resistant outer layers and a relatively soft layer attached to and in between said outer layers, said outer layers defining apertures for access to portions of said substrate and said photodetector body not part of the desired individual photodetector elements, said first outer layer being closer to said photodetector body and defining a smaller aperture than the aperture defined by said second outer layer, so that a line from the aperture of said second outer layer to the aperture of first outer layer intersects said substrate at an angle of from 30° to 60° with respect to the plane of the substate, thereby defining a bevel angle;
    air abrading said mask in a direction essentially parallel to said bevel angle to remove undesirable photodetector body and adhesive from said substrate;
    whereby said photodetector elements and adhesive remaining have at least one bevelled edge; and
    removing said mask from the remaining individual photodetector elements thereby formed.

2. The method of claim 1 wherein said mask is from 0.15 millimeters to 0.25 millimeters thick.

3. The method of claim 1 said erosion resistant outer layers of said mask are selected from the group consisting of nickel, steel, chrome and alloys thereof.

4. The method of claim 1 wherein said inner layer of said mask is selected from the group consisting of copper, lead, tin and alloys thereof.

5. The method of claim 1 wherein said bevelled angle ranges from 40° to 50°, with respect to the plane of the substrate.

6. A plurality of photodetector elements mounted on a substrate for use in an array, comprising:
    a substrate;
    a plurality of photodetector elements adhesively bonded to said substrate by placement of an adhesive layer between said elements and said substrate, wherein at least one side of said element and said adhesive is sloped at a bevelled angle of from 30° to 60° with respect to the plane of the substrate;
    said elements being formed from a body of said photodetector by air abrasion through a mask to remove portions of said adhesive layer and said photodetector body not forming said elements, said air abrasion being directed in a direction parallel to said bevelled angle;
    said mask having first and second outer layers defining apertures for access to portions of said substrate and said photodetector body, said first outer layer being closer to said photodetector body and defining an aperture smaller than the aperture defined by said second outer layer so that a line from the aperture of the second outer layer to the aperture of the first outer layer intersects said substrate and an angle of from 30° to 60° with respect to the plane of the substrate.

7. The device of claim 6 wherein said mask is from 0.15 millimeters to 0.25 millimeters thick.

8. The device of claim 6 wherein said erosion resistant outer layers of said mask are selected from the group consisting of nickel, steel, chrome and alloys thereof.

9. The device of claim 6 wherein said inner layer of said mask is selected from the group consisting of copper, lead, tin and alloys thereof.

10. The device of claim 6 wherein said bevelled angle ranges from 40° to 50°, with respect to the plane of the substrate.

11. The method of claim 1 which further includes the subsequent step of removing an additional portion of the photodetector elements without removing substantially any adhesive by etching said element, whereby said adhesive maintains said bevel angle above defined thereby and said remaining photodetector element defines a nearly equivalenet bevel angle with the respect to the plane of the substrate.

12. The device of claim 8, wherein said one side of said element is sloped at a nearly equivalent bevel angle with respect to the plane of the substrate, as said adhesive, said angle slope being formed after said first bevel angle is formed on said element and said adhesive, said adhesive maintaining its first bevel angle.

* * * * *